(12) United States Patent
Hsieh

(10) Patent No.: US 11,066,520 B2
(45) Date of Patent: Jul. 20, 2021

(54) VINYL-MODIFIED MALEIMIDE, COMPOSITION AND ARTICLE MADE THEREBY

(71) Applicant: Elite Material Co., Ltd., Taoyuan (TW)

(72) Inventor: Chen-Yu Hsieh, Taoyuan (TW)

(73) Assignee: ELITE MATERIAL CO., LTD., Taoyuan (TW)

( * ) Notice: Subject to any disclaimer, the term of this patent is extended or adjusted under 35 U.S.C. 154(b) by 265 days.

(21) Appl. No.: 15/838,506

(22) Filed: Dec. 12, 2017

(65) Prior Publication Data

US 2018/0362715 A1 Dec. 20, 2018

(30) Foreign Application Priority Data

Jun. 20, 2017 (TW) .................. 106120604

(51) Int. Cl.
| | | |
|---|---|---|
| *C08G 73/12* | (2006.01) | |
| *C08G 73/10* | (2006.01) | |
| *C09D 179/08* | (2006.01) | |
| *C08K 3/36* | (2006.01) | |
| *C08J 5/24* | (2006.01) | |
| *H05K 1/03* | (2006.01) | |
| *C08K 7/18* | (2006.01) | |
| *C09J 179/08* | (2006.01) | |
| *C08K 5/00* | (2006.01) | |

(52) U.S. Cl.
CPC ....... *C08G 73/127* (2013.01); *C08G 73/1071* (2013.01); *C08G 73/124* (2013.01); *C08J 5/24* (2013.01); *C08K 3/36* (2013.01); *C08K 7/18* (2013.01); *C09D 179/08* (2013.01); *C09D 179/085* (2013.01); *C09J 179/085* (2013.01); *H05K 1/0326* (2013.01); *H05K 1/0373* (2013.01); *C08J 2379/08* (2013.01); *C08K 5/0066* (2013.01); *H05K 1/0346* (2013.01)

(58) Field of Classification Search
CPC .............. C08G 73/1071; C08G 73/124; C08G 73/127; C08J 2379/08; C08J 5/24; C09D 179/08; C09D 179/085; C09J 179/085

See application file for complete search history.

(56) References Cited

U.S. PATENT DOCUMENTS

| | | | | |
|---|---|---|---|---|
| 5,128,428 A | * | 7/1992 | Shinohara | ............. C08F 212/14 526/262 |
| 5,156,656 A | * | 10/1992 | Parker | ................ B01D 67/0093 95/53 |
| 2009/0312519 A1 | * | 12/2009 | Uera | .................. C07D 207/408 528/322 |

FOREIGN PATENT DOCUMENTS

| | | | |
|---|---|---|---|
| JP | 06199883 A | * | 7/1994 |
| JP | 2016219640 A | * | 12/2016 |
| TW | 201708401 A | | 3/2017 |

OTHER PUBLICATIONS

Machine translation of JP-2016219640-A, retrieved Feb. 14, 2020. (Year: 2016).*
Machine translation of JP-06199883-A, retrieved Feb. 14, 2020 (Year: 1994).*
Office Action dated Nov. 20, 2017 in corresponding Taiwanese application(Search Report included), English translation provided, 5 pages total.

* cited by examiner

*Primary Examiner* — Callie E Shosho
*Assistant Examiner* — Krupa Shukla
(74) *Attorney, Agent, or Firm* — Bacon & Thomas, PLLC

(57) ABSTRACT

The present invention discloses vinyl-modified maleimide, a resin composition using the same and a preparation thereof. The vinyl-modified maleimide has better solvent selectivity and solvent compatibility. The obtained preparation can satisfy the properties of no crack between multilayer boards and high frequency and low dielectric properties maintained after moisture absorption.

6 Claims, 1 Drawing Sheet

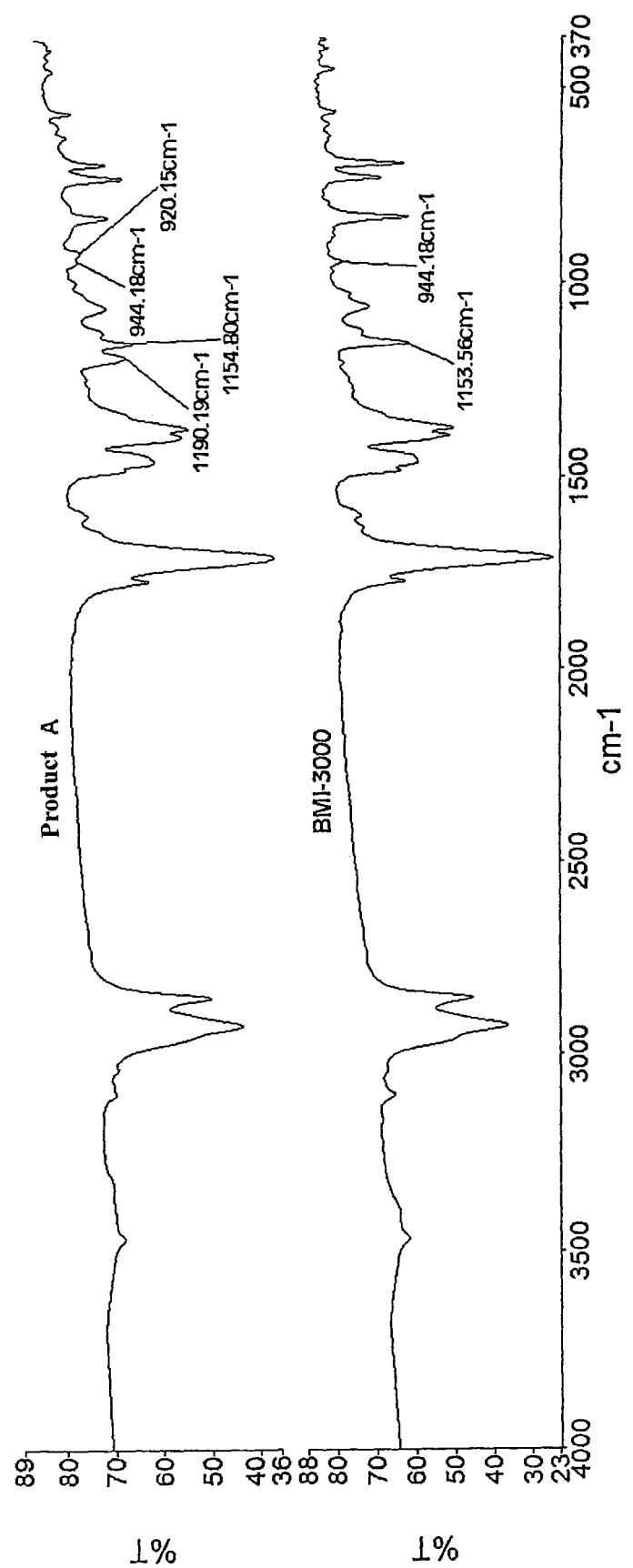

VINYL-MODIFIED MALEIMIDE, COMPOSITION AND ARTICLE MADE THEREBY

FIELD OF THE INVENTION

The present invention relates to vinyl-modified maleimide, especially to vinyl-modified maleimide with improved properties, and a resin composition including the vinyl-modified maleimide and an article made thereby.

BACKGROUND OF THE INVENTION

Copper clad laminates and prepregs are basic raw material for manufacturing a printed circuit board. The quality of the printed circuit board depends on the varnish used in the manufacture of a copper clad laminate and a prepreg. The resin of the varnish conventionally used in the manufacture of the copper clad laminate and the prepreg can be at least one selected from epoxy resin, cyanate ester, maleimide, polyphenylene oxide resin, a phenolic curing agent, an amine curing agent, polyester, an anhydride curing agent and a combination thereof. An additional additive, such as an inorganic filler, a curing accelerator and a solvent, can be added.

Maleimide is a cross-linking agent used to improve glass transition temperatures and thermal resistance. However, maleimide has problem of solvent selectivity and solvent incompatibility with other resins or curing agents. Solvent selectivity means that maleimide is hard to dissolve in other polar solvent in addition to dimethyl acetamide (DMAC) and N-methyl-2-pyrrolidone (NMP) and also cannot dissolve in a non-polar solvent. Solvent incompatibility means that during the process of making a prepreg, after maleimide that has been dissolved in a solvent is added to a varnish and left for a while, maleimide will precipitate from the varnish. Thus, the properties of the later-obtained copper clad laminate or printed circuit board, such as the appearance, dielectric properties and thermal resistance, will get worse.

In a conventional method, maleimide and cyanate ester form a bismaleimide triazine (BT) resin. However, the use of cyanate ester leads to high hygroscopicity and other disadvantages.

In a conventional method, maleimide and diallyl bisphenol A form a prepolymer. However, the laminate or printed circuit board made from such the prepolymer has poor thermal resistance.

In a conventional method, maleimide and a diamine curing agent form a prepolymer. However, the laminate or printed circuit board made from such the prepolymer has poor dielectric properties.

In a conventional method, maleimide and an aminophenol curing agent form a prepolymer. However, the laminate or printed circuit board made from such the prepolymer has poor dielectric properties.

Interlayer crack usually happens in multi-layer laminates and multi-layer printed circuit boards made from each of conventional bismaleimide triazine (BT) resins, the prepolymer of maleimide and diallyl bisphenol, the prepolymer of maleimide and the diamine curing agent and the prepolymer of maleimide and aminophenol or a mixture thereof, thereby decreasing the process yield of printed circuit boards.

BRIEF SUMMARY OF THE INVENTION

The main purpose of the present invention is to provide vinyl-modified maleimide, which has better solvent selectivity, and thus can dissolve in a conventional polar solvent, such as ketone solvents.

Another purpose of the present application is to provide vinyl-modified maleimide, which will not precipitate after dissolving in a solvent and left for a while.

Another purpose of the present invention is to provide vinyl-modified maleimide. The copper clad laminate and printed circuit board made from such vinyl-modified maleimide have better process yield and interlayer crack can be effectively prevented.

A further purpose of the present invention is to provide vinyl-modified maleimide. The copper clad laminate and printed circuit board made from such vinyl-modified maleimide have a better high frequency dielectric property.

A further purpose of the present invention is to provide vinyl-modified maleimide. The copper clad laminate and printed circuit board made from such vinyl-modified maleimide still can maintain a better high frequency dielectric property after moisture absorption.

To achieve the above purposes, the present invention provides a vinyl-modified maleimide comprising a structure represented by one of the following formula (1) and formula (2):

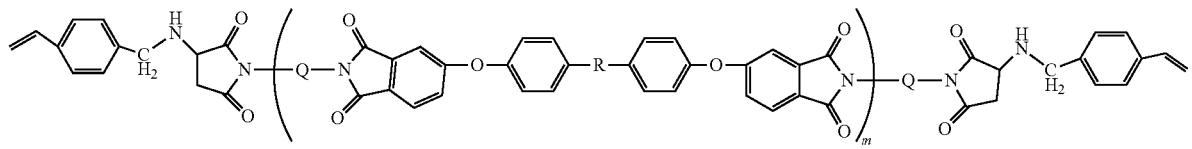

formula (1),
wherein R is a covalent bond, —$CH_2$—, —$CH(CH_3)$—, —$C(CH_3)_2$—, —O—, —S—, —$SO_2$— or carbonyl; Q is a C5 to C50 aliphatic group; and m is a integer of from 1 to 10; and

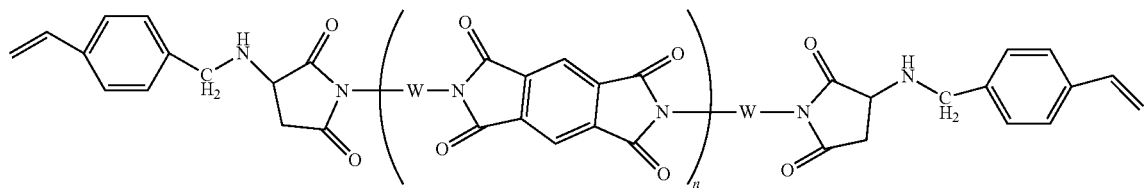

formula (2),
wherein W is a C5 to C50 aliphatic group, n is a integer of from 1 to 10.

In one preferable embodiment of the present invention, the vinyl-modified maleimide of the present application has a structure represented by one of the following formula (2) and formula (3):

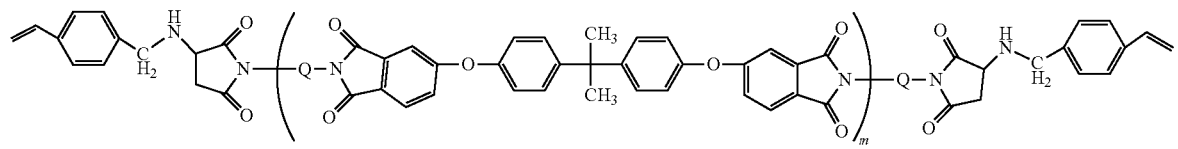

formula (3),
wherein Q is a C5 to C50 aliphatic group; m is a integer of from 1 to 10; and

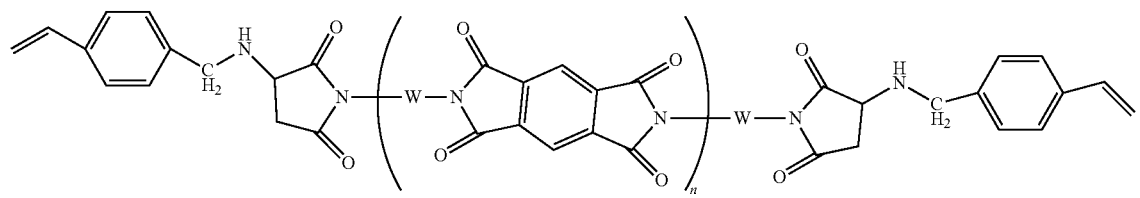

formula (2),
wherein W is a C5 to C50 aliphatic group; and n is a integer of from 1 to 10.

In a preferable embodiment of the present invention, the vinyl-modified maleimide of the present invention has a structure represented by one of the following formula (4) and formula (5):

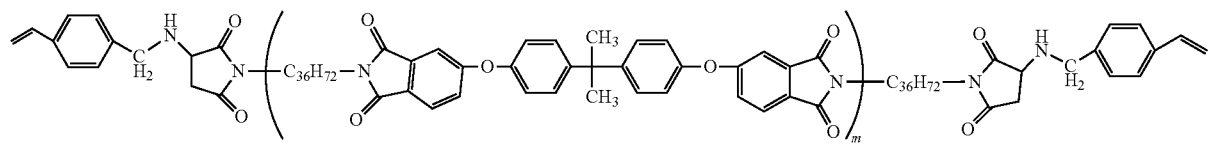

formula (4),
wherein m is a integer of from 1 to 10; and

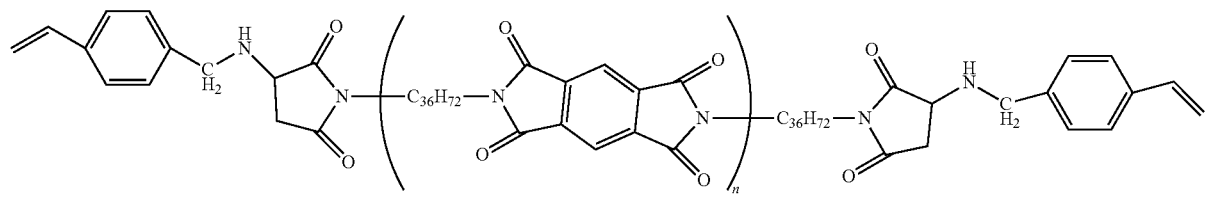

formula (5),
wherein n is a integer of from 1 to 10.

To achieve the above purposes, the present invention provides a vinyl-modified maleimide, which is obtained by the reaction of vinylamine with aliphatic long chain maleimide. For example, the vinyl-modified maleimide can be obtained by polymerizing vinylamine and aliphatic long chain maleimide. For example, a vinyl-modified maleimide prepolymer can be obtained by prepolymerizing vinylamine and aliphatic long chain maleimide.

Unless otherwise indicated, the term "vinyl-modified maleimide" can also be referred to as "vinyl-modified maleimide compound," "vinyl-modified maleimide prepolymer" or "vinyl-modified maleimide resin." The above terms can be used interchangeably, and they all refer to a product obtained from the reaction (such as prepolymerization) of vinylamine with aliphatic long chain maleimide.

Vinylamine can be, for example, but is not limited to vinyl amine or allyl amine, wherein vinyl amine can be, but is not limited to vinylbenzyl amine.

Preferably, vinylbenzyl amine can be, for example, but is not limited to 4-vinylbenzyl amine.

Allyl amine can be, but is not limited to allyl phenyl amine or allyl benzyl amine.

Preferably, allyl amine can be N-allyl phenyl amine or N-allyl benzyl amine.

Aliphatic long chain maleimide can be, for example, but is not limited to maleimide containing a C5 to C50 aliphatic structure in the structural formula. In one embodiment of the present invention, maleimide containing a C10 to C50 aliphatic structure in the structural formula is preferable. Aliphatic long chain maleimide can be maleimide having a long chain and a C5 to C50 aliphatic structure in the structural formula, or can be long chain maleimide having a branched chain and a C5 to C50 aliphatic structure in the structural formula. In one embodiment, maleimide having a long chain and a C10 to C50 aliphatic structure in the structural formula, or long chain maleimide having a branched chain and a C10 to C50 aliphatic structure in the structural formula is preferable.

The above-mentioned aliphatic long chain maleimide can be, but is not limited to the following structures:

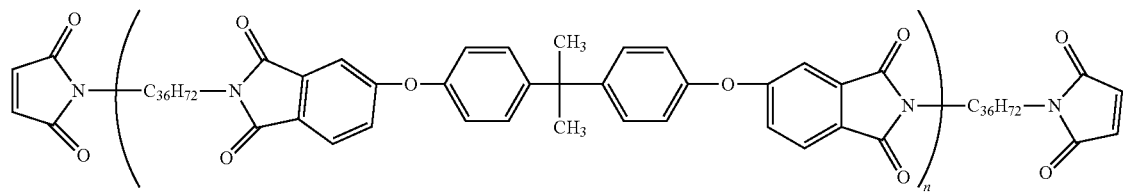

formula (6), wherein n=1 to 10;

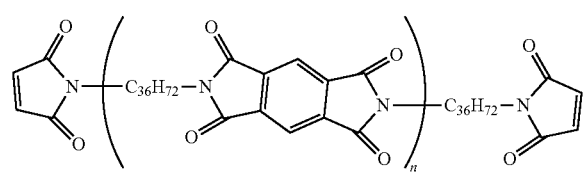

formula (7), wherein n=1 to 10.

The aliphatic long chain maleimide of formula (7) preferably can be the structure of formula (8):

The reaction or pre-reaction in the present invention means that after aliphatic long chain maleimide is dissolved in a solvent with an appropriate amount, vinylamine is further added, mixed well, and stirred under heating at 60-110° C. for 2 to 12 hours. The solvent can include, but is not limited to dimethyl acetamide, N-methyl-2-pyrrolidone, toluene and xylene. One embodiment of the present invention is to stir under heating at 80 to 100° C. for 2 to 12 hours.

In another aspect, the present invention provides a resin composition including the above vinyl-modified maleimide and at least one cross-linking agent.

In one example, the cross-linking agent includes divinyl benzene (DVB), bis(vinylbenzyl) ether (BVBE), 1,2-bis (vinylphenyl)ethane (BVPE), triallyl isocyanurate (TAIC), triallyl cyanurate (TAC), cyanate ester, isocyanate ester, 1,2,4-trivinylcyclohexane (TVCH), styrene, acrylate (such as, tricyclodecane di(methyl)acrylate, tri(methyl) acrylate), polyphenylene oxide resin, polyamide, polyimide, a styrene maleic anhydride copolymer, polyester, an olefin polymer, epoxy resin or an anhydride curing agent, a prepolymer or a combination thereof.

For example, unless otherwise indicated, the polyphenylene oxide resin used in the present invention is not particularly limited, and can be one or more commercial products, homemade products or a combination thereof. Examples include, but are not limited to dihydroxy polyphenylene oxide (such as SA-90, commercially available from Sabic Company), divinylbenzyl polyphenylene oxide (such as OPE-2st, commercially available from MITSUBISHI GAS CHEMICAL COMPANY, INC.), (meth)acrylic polyphenylene oxide (such as SA-9000, commercially avail-

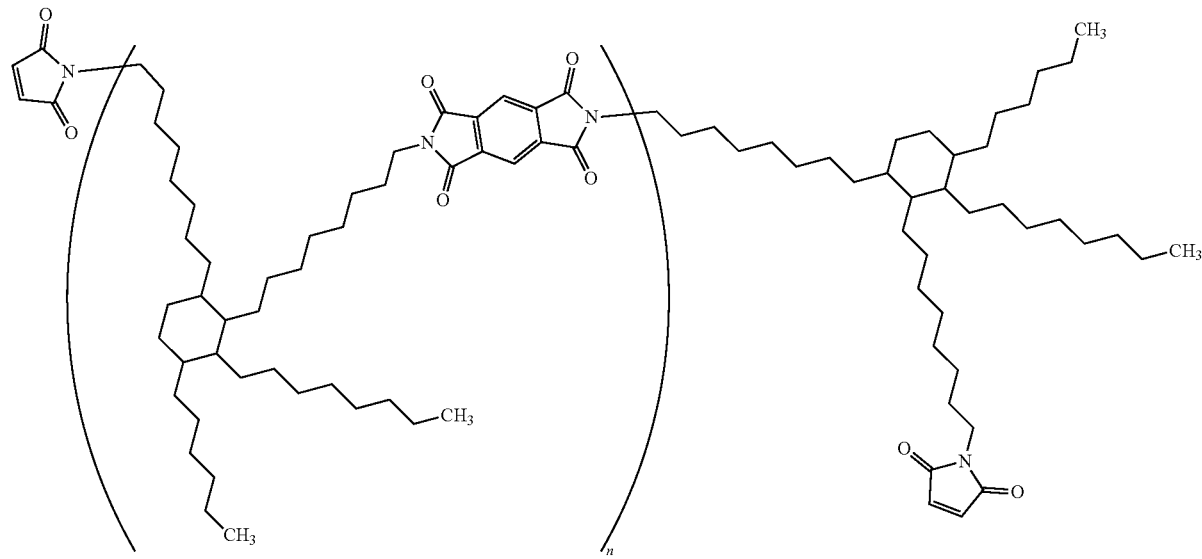

formula (8), wherein n=1 to 10.

The aliphatic long chain maleimide (maleimide having an aliphatic structure) can be, for example, but is not limited to BMI-689, BMI-1400, BMI-1500, BMI-1700, BMI-2500, BMI-3000, BMI-5000 or BMI-6000. The above-mentioned maleimide having an imide structure is commercially available from Designer Molecules Inc.

In one embodiment of vinyl-modified maleimide, the ratio (part by weight) of vinylamine to aliphatic long chain maleimide is 10:90 to 40:60. In one preferable embodiment, the ratio (part by weight) of vinylamine to aliphatic long chain maleimide is 20:80 to 35:65.

able from Sabic Company), vinyl benzyl modified bisphenol A polyphenylene oxide and chain extension polyphenylene oxide.

For example, the above chain extension polyphenylene oxide can include various polyphenylene oxide resins described in U.S. Patent Publication No. 2016/0185904 A1, which is incorporated herein in its entirety by this reference.

For example, Unless otherwise indicated, the olefin polymer used in the present invention is not particularly limited, and can be one or more commercial products or a combination thereof. Examples include, but are not limited to a styrene-butadiene-divinylbenzene terpolymer, a styrene-butadiene-maleic anhydride terpolymer, a vinyl-polybutadiene-urethane oligomer, a styrene butadiene copolymer, a hydrogenated styrene butadiene copolymer, a styrene isoprene copolymer, a hydrogenated styrene isoprene copolymer, a methyl styrene copolymer, a petroleum resin and a cyclic olefin copolymer and a combination thereof.

Unless otherwise indicated, the polyester used in the present invention is not particularly limited, and can be one or more commercial products or a combination thereof. Examples include, but are not limited to HPC-8000 available from DIC.

In one example, the resin composition includes 100 parts by weight of vinyl-modified maleimide and 1 to 500 parts by weight of a cross-linking agent, preferably, 100 parts by weight of vinyl-modified maleimide and 1 to 300 parts by weight of a cross-linking agent, more preferably, 100 parts by weight of vinyl-modified maleimide and 1 to 100 parts by weight of a cross-linking agent.

The resin composition of the present invention can further optionally include at least one property modifier, such as a flame retardant, a curing accelerator, an inorganic filler, a surfactant, a toughener, a solvent and a combination thereof.

For example, the flame retardant can be a bromine-containing flame retardant or a phosphorus-containing flame retardant. The phosphorus-containing flame retardant can be at least one, but is not limited to, of the following compounds: bisphenol diphenyl phosphate, ammonium polyphosphate, hydroquinone bis-(diphenyl phosphate), bisphenol A bis-(diphenylphosphate), tri(2-carboxyethyl) phosphine (TCEP), Tri(chloroisopropyl)phosphate, trimethyl phosphate (TMP), dimethyl methyl phosphonate (DMMP), resorcinol bis(dixylenyl phosphate) (RDXP, such as PX-200, available from DAIHACHI CHEMICAL INDUSTRY CO., LTD.), phosphazene (such as SPB-100, available from Otsuka Chemical Co., Ltd.), m-phenylene methylphosphonate (PMP), melamine polyphosphate, 9,10-dihydro-9-oxa-10-phosphaphenanthrene-10-oxide (DOPO), a DOPO-containing phenol resin (such as a DOPO-HQ-containing resin, a DOPO-containing phenolic resin (DOPO-PN resin), a DOPO-containing bisphenol phenolic resin (DOPO-BPN resin), a bis-DOPO flame retardant, a tri-DOPO flame retardant, diphenyl phosphine oxide (DPPO) compound, and a diphenyl phosphine oxide derivative. The DOPO-BPN resin can be DOPO-bisphenol A novolac (DOPO-BPAN), DOPO-bisphenol F novolac (DOPO-BPFN), or DOPO-bisphenol S novolac (DOPO-BPSN).

For example, the curing accelerator can include catalysts, such as Lewis bases or Lewis acids, or peroxide. Lewis bases can include one or more of imidazole, a boron amine trifluoride complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP) and 4-dimethylaminopyridine (DMAP). Lewis acids can include metal salts, such as manganese, iron, cobalt, nickel, copper, zinc and metal catalysts, such as zinc octoate and cobalt octoate. Preferably, the curing accelerator is peroxide that can produce free radicals, and includes, but is not limited to dicumyl peroxide, tert-butyl peroxybenzoate, di-tert-butyl diisopropylbenzene peroxide, and 2,5-dimethyl-2,5-di(tert-butyl peroxide)hexyne-3.

For example, the inorganic filler can include at least one of silicon dioxide (fused state, non-fused state, porous or hollow), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcined talc, talc, silicon nitride and calcined kaolin. Preferably, the inorganic filler is spherical, fibrous, plate, granular, flaky or needle-like, and can be optionally pre-treated by a silane coupling agent (a silane or siloxane compound).

For example, the main purpose of adding a surfactant is to allow inorganic fillers to uniformly disperse in a resin composition. The surfactant can include a silane compound and a siloxane compound.

For example, the main purpose of adding a toughener is to improve the toughness of a resin composition. The toughener can include an additive, such as a rubber resin, carboxyl-terminated butadiene acrylonitrile rubber (CTBN), and core-shell rubber.

For example, the main purpose of adding a solvent is to change the solid content of a resin composition, and adjust the viscosity of the resin composition. The solvent can include methanol, ethanol, ethylene glycol monomethyl ether, acetone, butanone (also known as methyl ethyl ketone), methyl isobutyl ketone, cyclohexanone, toluene, xylene, methoxy ethyl acetate, Ethoxyethyl acetate, propoxyethyl acetate, ethyl acetate, dimethyl formamide, propylene glycol methyl ether or a mixed solvent.

Thus, a copper clad laminate made from the vinyl-modified maleimide is provided. The vinyl-modified maleimide not only can effectively improve the interlayer crack between laminates, but also improve the thermal resistance of a laminate, lower dielectricity, increase adhesion, and maintain low dielectricity even after the laminate absorbs moisture.

Therefore, the vinyl-modified maleimide can provide the thus-obtained prepreg with good resin flow and hole-filling properties.

The resin composition of the present invention can further include other types of maleimide. Unless otherwise indicated, the other types of maleimide used in the present invention are not particularly limited, and can be one or more commercial products or a combination thereof. Examples include, but are not limited to 4,4'-diphenylmethane bismaleimide, an oligomer of phenylmethane maleimide (or called phenylmethane maleimide polymer), m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6-bismaleimide-(2,2,4-trimethyl)hexane, N-2,3-xylylmaleimide, N-2,6-xylenemaleimide, N-phenylmaleimide and at least one prepolymer of the above compounds and a combination thereof. Examples of the prepolymer include the prepolymer of a diallyl compound and a maleimide compound, the prepolymer of diamine and a maleimide, the prepolymer of polyfunctional amine and a maleimide compound, for example, but are not limited to maleimide commercially available from Daiwa Fine Chemicals Co., Ltd, HOS Technik Vertriebs, KI CHEMICAL COMPANY or Designer Molecules Inc.

Preparation of Resin Composition

The above resin composition can be used to prepare various articles by many processing methods, for example, elements suitable for electronic products, including, but not limited to a resin film, a resin coated copper, a prepreg, a laminate and a printed circuit board.

For example, the resin composition of the present invention can be coated on a PET film (polyester film) or a PI film (polyimide film) and baked to become a semi-cured state (B-Staged), thereby obtaining a resin film.

For example, the resin composition of the present invention can be coated on a copper foil and baked to become a semi-cured state, thereby obtaining a resin coated copper (RCC).

For example, the resin composition of the present invention can be used to prepare (e.g., make) a prepreg, which has a reinforcing material and a layer (insulating layer) disposed on the reinforcing material. The layer is formed by baking the aforesaid resin composition at a high temperature to provide a semi-cured state. The baking temperature for making a prepreg is, for example, 120° C. to 140° C. The reinforcing material can be any one of a fibrous material, woven fabric, non-woven fabric, a liquid crystal resin film, a PET film (polyester film) and a PI film (polyimide film). Moreover, woven fabric preferably includes glass fiber fabric. The type of the glass fiber fabric is not particularly limited, and can be commercial glass fiber fabric suitable for various printed circuit boards, for example, E type fiberglass fabric, D type fiberglass fabric, S type fiberglass fabric, T type fiberglass fabric, L type fiberglass fabric or NE fiberglass fabric. The type of fiberglass fabric includes yarn and roving. The form of fiberglass fabric can include spread form or standard form. The non-woven fabric preferably includes liquid crystal polymer resin non-woven fabric, such as polyester non-woven fabric and polyurethane non-woven fabric, but not limited to these. This reinforcing material can improve the mechanical strength of the prepreg. Preferably, the reinforcing material can also be optionally pre-treated by a silane coupling agent.

For example, the resin composition of the present invention can be used to prepare various laminates, such as copper clad laminate, which includes two copper foils and one insulating layer (such as the above layer). The insulating layer is disposed between copper foils, and the insulating layer can be formed by curing the above resin composition at a high temperature and a high pressure. A suitable curing temperature is, for example, between 190° C. and 220° C., preferably between 200° C. and 210° C. The curing time is 100 to 180 minutes, preferably 120 to 150 minutes. The insulating layer can be the above prepreg or a resin film. Preferably, the laminate is a copper clad laminate.

The laminate can be further wire processed to provide a printed circuit board.

Property Illustration

The resin composition of the present invention and articles made therefrom, such as a resin film, a prepreg, a resin coated copper, a laminate or a printed circuit board, can achieve one or more or all of the following ideal properties: better resin flow and better laminate appearance. The thus-obtained laminates have an ideal glass transition temperature, coefficient of thermal expansion, thermal expansion rate, thermal resistance, dielectric property and flame retardance.

The present invention is different from the resin composition having different conventional components and ratios. The present invention encompasses a combination that can achieve any one, any two or more of the above properties, or a resin composition and an article made thereby. that can achieve all of the above properties, thereby satisfying industrial needs.

For sufficiently understanding the purposes, features and effects of the present invention, the present invention is described in more detail below through the following specific examples.

BRIEF DESCRIPTION OF THE DRAWINGS

FIG. 1 is the FTIR spectrogram comparing vinyl-modified maleimide product A of Preparation Example 1 with reactant BMI-3000, wherein T % represents transmittance, and $cm^{-1}$ represents wave number.

DETAILED DESCRIPTION OF THE INVENTION

To allow a person skilled in the art to understand the features and effects of the present invention, terms and phrases used in the specification and claims are illustrated and defined in the following. Unless otherwise indicated, all technical and scientific terms used herein should have common meanings known by a person skilled in the art while the definitions in the specification should be based when conflict occurs.

In the present application, terms "comprising," "including," "having," "containing" and other similar terms all belong to open-ended transitional phrases and intend to encompass other non-exclusive components. For example, one composition or preparation containing a plurality of elements should not be limited to the listed elements, but also can include other conventional elements that are not specifically listed. In addition, unless expressly indicated to the contrary, term "or" refers to inclusive "or" rather than exclusive "or." For example, any one of the following situations satisfies the condition "A or B." A is true (or present) and B is false (or not present); A is false (or not present) and B is true (or present); and both A and B are true (or present). In addition, in the present application, terms "comprising," "including," "having" and "containing" should be interpreted to specifically disclose and encompass "consisting of . . . " (close-ended phrase) and "essentially consisting of . . . " (semi-close ended phrase).

In the present application, features or conditions defined by numeral ranges or percentage ranges are for concise and convenience. As such, the description of numeral ranges or percentage ranges should be treated to encompass and specifically disclose individual numbers in all possible sub-ranges and ranges, especially integer numbers. For example, the range description of "1 to 8" should be treated to specifically disclose all sub-ranges, such as 1 to 7, 2 to 8, 2 to 6, 3 to 6, 4 to 8, and 3 to 8, especially all sub-ranges defined by integer numbers, and should be treated to specifically disclose individual numbers in the range, such as 1, 2, 3, 4, 5, 6, 7 and 8. Unless otherwise indicated, the above definition applies to all content of the present application, regardless of the range.

If numbers or other numeral values or parameters are presented in a range, a preferable range or a series of upper limits and lower limits, it should be interpreted that all ranges constituted by any pairs of the upper limit (or preferable value) of a range and the lower limit (or preferable value) of a range are specifically disclosed, despite of whether the ranges are respectively disclosed or not. In addition, when the range of the numeral numbers is referred to herein, unless otherwise indicated, the range shall include its endpoints and all integers and fractions within the range.

In the present application, under the condition that the purposes of the present invention can be achieved, numeral values should be interpreted to have the accuracy of the significant digits of the numeral values. For example, number 40.0 should be interpreted to encompass the range of 39.50 to 40.49.

In the present application, for the situation that a Markush group and optional terms are used to describe the features or examples of the present application, a person skilled in the art should understand that sub-groups or any individual members in the Markush group and option list can also be used to describe the present invention. For example, if X is described to be "selected from the group consisting of X1, X2 and X3," and Y is described to be "selected from the group consisting of Y1, Y2 and Y3," it should include the situations that X is X1, X is X1 and/or X2, and X is X1 or X2 or X3 while Y is Y1 or Y2 or Y3.

The following embodiments are illustrative only, but are not intended to limit the present invention and uses thereof. In addition, the present application is not bounded by any theories described in the prior art, the summary of the present invention or the following embodiments.

Preparation Example: Synthesis of Vinyl-Modified Maleimide

Preparation Example 1-1. Synthesis of Vinyl-Modified Maleimide of the Present Invention 100 g of BMI-3000 light yellow solid powder was added to 100 g of a toluene solvent in a glass stirring reaction tank, heated to 50° C. and stirred until the solid powder was completely dissolved to form a brown clear solvent. 15 g of 4-vinylbenzyl amine (VBA) was further added to the reaction tank and stirred until VBA was completely mixed. The solution was heated to 95° C. under stirring for 4 hours. Then, the solution was cooled to room temperature to obtain a product, vinyl-modified maleimide solution. The solvent can be removed from this solution by using conventional techniques (for example vacuum distillation) to give a solid product A (Product A).

Product A made from Preparation Example 1-1 and material BMI-3000 were analyzed by Fourier transform infrared spectroscopy (FTIR). The results shown in FIG. 1 reveal that the product of Preparation Example 1-1 has a vinyl characteristic peak from vinylbenzyl at 920.15 cm$^{-1}$, suggesting that the obtained product is vinyl-modified maleimide.

Preparation Example 1-2. Synthesis of Vinyl-Modified Maleimide of the Present Invention The method for preparing vinyl-modified maleimide is the same as that in Preparation Example 1-1, except that 100 g of BMI-3000 and 15 g of 4-vinylbenzyl amine in Preparation Example 1-1 were replaced with 66.5 g of BMI-3000 and 33.5 g of 4-vinylbenzyl amine, respectively. The product made from Preparation Example 1-2 is Product B.

Preparation Example 1-3. Synthesis of Vinyl-Modified Maleimide of the Present Invention The method for preparing vinyl-modified maleimide is the same as that in Preparation Example 1-1, except that 100 g of BMI-3000 and 15 g of 4-vinylbenzyl amine in Preparation Example 1-1 were replaced with 80 g of BMI-3000 and 20 g of 4-vinylbenzyl amine, respectively. The product made from Preparation Example 1-3 is Product C.

Preparation Example 1-4. Synthesis of Vinyl-Modified Maleimide of the Present Invention The method for preparing vinyl-modified maleimide is the same as that in Preparation Example 1-1, except that 100 g of BMI-3000 and 15 g of 4-vinylbenzyl amine in Preparation Example 1-1 were replaced with 66.5 of BMI-1700 and 33.5 g of 4-vinylbenzyl amine, respectively. The product made from Preparation Example 1-4 is Product D.

Preparation Example 1-5. Synthesis of Vinyl-Modified Maleimide of the Present Invention The method for preparing vinyl-modified maleimide is the same as that in Preparation Example 1-1, except that 100 g of BMI-3000 and 15 g of 4-vinylbenzyl amine in Preparation Example 1-1 were replaced with 66.5 g of BMI-70 and 33.5 g of 4-vinylbenzyl amine. The product made from Preparation Example 1-4 is Product E.

Preparation Example 1-6. Synthesis of Terminal Hydroxyl-Modified Maleimide

The method used in this Example is the same as that in Preparation Example 1-2, except that 33.5 g of 4-vinylbenzyl amine in Preparation Example 1-2 was replaced with 33.5 g of 2,2'-diallyl bisphenol A. The product made from Preparation Example 1-6 is Product F.

Preparation Example 1-7. Synthesis of Terminal Hydroxyl-Modified Maleimide

The method used in this Example is the same as that in Preparation Example 1-2, except that 33.5 g of 4-vinylbenzyl amine in Preparation Example 1-2 was replaced with 33.5 g of p-aminophenol. The product made from Preparation Example 1-7 is Product G.

Preparation Example 1-8. Synthesis of Terminal Amino-Modified Maleimide

The method used in this Example is the same as that in Preparation Example 1-2, except that 33.5 g of 4-vinylbenzyl amine in Preparation Example 1-2 was replaced with 33.5 g of 4,4'-oxydianiline(ODA). The product made from Preparation Example 1-8 is Product H.

Product A, Product B, Product C and Product D from Preparation Examples 1-1 to 1-4 all can dissolve in toluene and butanone solvents, and would not precipitate even after being left for 48 hours. Product E from Preparation Example 1-5 cannot dissolve in toluene.

Example

Raw materials are obtained from the following sources. The resin compositions of Examples and Comparative Examples of the present invention were formulated, respectively, based on the amounts listed in Tables 1-4, and were further prepared to become various test specimens or preparations.

Vinylbenzyl polyphenylene oxide: Trade name OPE-2st, available from MITSUBISHI GAS CHEMICAL COMPANY, INC.

Bis-(3-ethyl-5-methyl-4-maleimidephenyl)methane: Trade name: BMI-70, available from KI Chemical.
Aliphatic long chain maleimide 1: Trade name: BMI-3000, available from Designer Molecules Inc.
Aliphatic long chain maleimide 2: Trade name: BMI-1700, available from Designer Molecules Inc.
3,3',4,4'-Biphenyltetracarboxylic dianhydride: Trade name: BPDA, available from Sigma-Aldrich Co., LLC.
4-vinylbenzyl amine (VBA), available from LINCHUAN CHEMICAL CO., LTD.
2,2'-diallylbisphenol A (DABPA), available from Sigma-Aldrich Co., LLC.
P-aminophenol, available from Sigma-Aldrich Co., LLC.
4,4'-oxydianiline, available from Kingyorker Enterprise Co. Ltd.
Peroxide: Trade name: 25B, available from NOF CORPORATION.
Spherical silica: Trade name: 2500SMJ, available from Admatechs Company Limited.
Preparation of Varnish As shown in the following Tables 1-4, for each Example (represented by E, such as E1 and E2) or Comparative Example (represented by C, such as C1 and C2), the components were added to a stirring tanks based on the amounts in Tables for stirring, and mixed well to form a resin composition, called a varnish. For solid substances, the addition amount for each component (except the solvent) of the resin compositions in Tables is calculated based on parts by weight. For liquid substances, the solvent is also calculated based on parts by weight.

The products or test specimens made from the resin compositions of the present invention and the methods for manufacturing the same are illustrated in the following.

Prepreg: Each of the resin compositions from Examples and Comparative Examples was placed in an impregnation tank. Glass fiber fabric (1080 or 2116 E-glass fiber fabric, or 1080 L-glass fiber fabric, available from Asahi CO., LTD) was impregnated in the above impregnation tank, such that the resin composition adhered to the glass fiber fabric. The thus-obtained glass fiber fabric was baked at 130° C. for about 2 minutes to obtain a prepreg.

Copper clad laminate (5-ply, laminated by five prepregs): Two HVLP (Hyper Very Low Profile) copper foils with a thickness of 18 microns and five prepregs of each test specimen (2116 E-glass fiber fabric) were provided. The resin content of each prepreg was about 52%. One copper foil, five prepregs and one copper foil were laminated in order, and were laminated under vacuum at 200° C. for 2 hours to form a copper clad laminate. Five prepregs were cured to for an insulating layer between two copper foils. The resin content of the insulating layer is about 52%.

Copper-free laminate (5-ply, laminated by five prepregs): The above copper clad laminates (5-ply) were etched to remove the copper foils on two sides, so as to obtain a copper-free laminate (5-ply). The copper-free laminate (5-ply) was formed by laminating five prepregs. The resin content of the insulating layer of the copper-free laminate (5-ply) was about 52%.

Copper-free laminate (2-ply, laminated by two prepregs): Two HVLP copper foils with a thickness of 18 microns and two prepregs of each test specimen (1080 L-glass fiber fabric) were provided. The resin content of each prepreg was about 68%. One copper foil, two prepregs and one copper foil were laminated in order, and were laminated under vacuum at 200° C. for 2 hours to form a copper clad laminate (2-ply). Then, The above copper clad laminates were etched to remove the copper foils on two sides, so as to obtain a copper-free laminate (2-ply). An insulating laminate was formed by laminating two prepregs. The resin content of the copper-free laminate (2-ply) was about 68%.

The test method for each property is illustrated as follows.

PP (prepreg) formability (resin content (RC) value test):

4 sheets of 4 (inches)×4 (inches) 2116 E-glass fiber fabric were provided by a punch press. Such 4 sheets of glass fiber fabric were weighted (W1). 4 sheets of prepregs (4 (inches)×4 (inches) (prepared by a method using 2116 E-glass fiber fabric) were provided by a punch press. Such 4 sheets of prepreg were weighted (W2). Resin Content %=[(W2−W1)/W2]×100%. If the RC value of a prepreg prepared by a method using 2116 is 52%, it suggests that such prepreg conforms to normal specifications. If the RC value of a prepreg prepared by a method using 2116 is smaller than 30%, it suggests that the resin flows out and cannot cure on a prepreg.

Resin Flow:

Referring to IPC-TM-650 2.3.17 regulations, 4 sheets of (4.0±0.010 inches)×(4.0±0.010 inches) prepregs prepared by a method using 2116 E-glass fiber fabric were weighted (Wo). 4 sheets of prepregs were laminated in the order of a steel plate/a release film/4 sheets of prepregs/a release film/a steel plate, and then were placed in a press machine and heat pressed at a temperature of 171±3° C. and a pressure of 200±10 psi for 5 minutes. The specimen was taken out after heat press and cooled to room temperature. A circular specimen with a diameter of 3.192 in (81.1 mm) was provided by a circular punch press. The circular specimen was weighted (Wd). The resin flow (%) was calculated based on the following formula.

$$\text{Resin flow \%}=[(Wo-2Wd)/Wo]\times 100\%.$$

If the resin flow is larger than 30%, it means that the resin flow is too large, such that the resin will flow out when a laminate is laminated, and a laminate with an appropriate thickness cannot be formed (an appropriate RC value cannot be obtained).

Resin Filling Property:

A prepreg was prepared by a method using 2 sheets of 2116 E-glass fiber fabric, sandwiched by two 2-ounce HTE (high temperature elongation) copper foils, and laminated to form a copper clad laminate. Conventional lithography was conducted on the copper foil on the surface to form a core laminate having surface wires. The surface wires were brown, and then each of two surfaces was laminated with 3 sheets of prepregs prepared by a method using 1080 E-glass fiber fabric and 2-Ounce HTE copper foils. A second copper clad laminate was formed after lamination. The copper clad laminate was sectioned by using conventional microsection and observed by optical microscope and scanning electron microscope (SEM) to check whether voids exist between wires. If voids exist, it means that the filling property is poor.

Dense Hole Test (Crack Prevention):

26-layer plates (formed by prepregs prepared by a method using 1080 E-glass fiber fabric) of Examples and Comparative Examples were prepared by a conventional multi-layer lamination process. A specimen was prepared to have a diameter of 0.25 mm (millimeter) (by mechanical drilling), a pitch of 0.7 mm between holes, and total number of pitch holes was 1000 holes. Desmearing and electroplating were then conducted on the specimen. The specimen passed through a 260° C. Reflow for six times, and was sectioned by a conventional microsection process. The specimen was observed by optical microscope to confirm whether delamination in pitch holes occurred. If yes, such pitch hole should be counted as a poor hole. The pass rate of a dense hole test=[1−(poor hole number/total observation hole number)]* 100%. 0.7 mm pitch between holes is more strict than 1.0 mm. Preferably, the pass rate is 100%.

Thermal Resistance T288:

A copper clad laminate (5-ply) with 6.5 mm×6.5 mm was used as a specimen. At a constant temperature of 288° C., a thermal mechanical analyzer (TMA) was used and based on the method described in IPC-TM-650 2.4.24.1, the time that no delamination occurred after the copper clad laminate was heated was measured. Generally, a longer time means that the thermal resistance of the copper clad laminate made from the resin composition is better.

Solder Dipping Test (S/D):

The method described in IPC-TM-650 2.4.23 to measure the above copper clad laminate (5-ply) was referred to. Each specimen was dipped in a solder pot with a constant temperature of 288° C. for 10 seconds, and then was taken out at room temperature for 10 seconds. The above steps were repeated and the repeat number was recorded until the laminate was delaminated. In general, the more the repeat number for each sample in solder dipping without delamination is, the better the thermal resistance of an article (such as copper clad laminate) made from the resin composition is.

PCT (Pressure Cooking Test) of Copper-Free Laminate

A copper-free laminate (5-ply) was placed in an environment at 121° C. with saturated vapor pressure for 3-hour moisture absorption and then dipped in a solder pot with a constant temperature of 288° C. for 20 seconds to observe whether delamination occurred. PCT is based on the method described in IPC-TM-650 2.6.16.1. Delamination means that the insulating layer of the laminate delaminates.

Dielectric Constant (Dk):

The above copper-free laminate (2-ply) was used as a specimen. A microwave dielectrometer (available from Japan AET Company) was used and based on the method described in JIS C2565 (Measuring methods for ferrite cores for microwave device), each specimen was measured at room temperature and a frequency of 10 GHz. Generally, the lower a dielectric constant is, the better the dielectric properties of a specimen are. The Dk value difference greater than 0.05 means that different laminates have a significant difference in dielectric constant.

Dissipation Factor (Df):

In the measurements of a dissipation factor, the above copper-free laminate (2-ply) was used as a specimen. A microwave dielectrometer (available from Japan AET Company) was used and based on the method described in JIS C2565 (Measuring methods for ferrite cores for microwave device), each specimen was measured at room temperature and a frequency of 10 GHz. Generally, the lower a dissipation factor is, the better the dielectric properties of a specimen are. The Df value difference smaller than 0.0005 means that laminates do not have a significant difference in dissipation factor while the Df value difference greater than 0.0005 means that different laminates has a significant difference in dissipation factor.

Dissipation Factor Post-Moisture Absorption

In the measure of a dissipation factor post-moisture absorption, the above copper-free laminate (2-ply) was used as a specimen. The specimen was placed in 121° C. saturated vapor pressure (referring to the PCT test of the above copper-free laminate) for 3-hour moisture absorption, and then a dissipation factor test was performed. The method for testing the dissipation factor is the same as that in the above.

Interlayer Adhesion:

A copper clad laminate (5-ply) was cut to become 12.7 mm (width)×larger than 60 mm (length), and then was tested by using a universal tensile strength testing machine based on the method described in IPC-TM-650 2.4.8, except that the surface copper foil was not etched and the test position was the joining surface between the $2^{nd}$ prepreg-layer and the $3^{rd}$ prepreg-layer. At room temperature (about 25° C.), the force (1b/in) needed to separate the $2^{nd}$ prepreg-layer and the $3^{rd}$ prepreg-layer in a cured insulating laminate was measured. Interlayer adhesion difference >0.1 (lb/in) represents significant difference.

In view of the resin compositions of Examples and Comparative Examples in Tables 1 and 3 and property test results in Tables 3 and 4, the copper clad laminates E1-E4 made from the resin compositions of the present invention have a better dense hole thermal resistance test (pitch=0.7 mm) pass rate and interlayer adhesion, good PP formability, resin filling property, T288 thermal resistance, solder dipping and thermal resistance after moisture absorption, and a low dielectric constant and a low dissipation factor. In addition, the dissipation factor changes on the copper clad laminates E1-E4 made from the resin compositions of the present invention after PCT moisture absorption are also the smallest. Thus, the copper clad laminate made from the resin composition of the present invention can maintain the excellent low-dissipation factor property even after moisture absorption.

TABLE 1

Constituent of resin compositions in Examples and Comparative Examples (Unit: parts by weight)

| Resin Constituent | Component | | E1 | E2 | E3 | E4 | E5 |
|---|---|---|---|---|---|---|---|
| Polyphenylene oxide | Vinylbenzyl polyphenylene oxide | OPE-2st | | | | 60 | |
| Maleimide | Terminal vinyl maleimide (VBA:BMI-3000 = 33.5:66.5) | Product B | 100 | | | 40 | 90 |
| | Terminal vinyl maleimide (VBA:BMI-3000 = 20:80) | Product C | | 100 | | | |
| | Terminal vinyl maleimide (VBA:BMI-1700 = 33.5:66.5) | Product D | | | 100 | | |
| | Terminal vinyl maleimide (VBA:BMI-70 = 33.5:66.5) | Product E | | | | | |
| | Terminal hydroxyl maleimide (DABPA/BMI-3000 = 33.5:66.5) | Product F | | | | | |
| | Terminal hydroxyl maleimide (aminophenol/BMI-3000 = 33.5:66.5) | Product G | | | | | |
| | Terminal amino maleimide (ODA/BMI-3000 = 33.5:66.5) | Product H | | | | | |
| | Maleimide | BMI-70 | | | | | 5 |
| | Aliphatic long chain maleimide | BMI-3000 | | | | | 5 |
| | Aliphatic long chain maleimide | BMI-1700 | | | | | |

TABLE 1-continued

Constituent of resin compositions in Examples and Comparative Examples (Unit: parts by weight)

| | | | | | | | | |
|---|---|---|---|---|---|---|---|---|
| Cross-linking agent | 3,3',4,4'-Biphenyltetracarboxylic dianhydride | BPDA | | | | | | |
| | Vinylbenzyl amine | VBA | | | | | | |
| | 2,2'-diallyl bisphenol A | DABPA | | | | | | |
| | P-aminophenol | | | | | | | |
| | 4,4'-oxydianiline | ODA | | | | | | |
| Peroxide | Peroxide | 25B | 1 | 1 | 1 | 1 | 1 | |
| Inorganic filler | Spherical silica | SC2500SMJ | 50 | 50 | 50 | 50 | 50 | |
| Solvent | Toluene | Toluene | 100 | 100 | 100 | 100 | 100 | |

| Resin Constituent | Component | | C1 | C2 | C3 | C4 | C5 | C6 |
|---|---|---|---|---|---|---|---|---|
| Polyphenylene oxide | Vinylbenzyl polyphenylene oxide | | | | | | | |
| Maleimide | Terminal vinyl maleimide (VBA:BMI-3000 = 33.5:66.5) | | | | | | | |
| | Terminal vinyl maleimide (VBA:BMI-3000 = 20:80) | | | | | | | |
| | Terminal vinyl maleimide (VBA:BMI-1700 = 33.5:66.5) | | | | | | | |
| | Terminal vinyl maleimide (VBA:BMI-70 = 33.5:66.5) | | 100 | | | | | |
| | Terminal hydroxyl maleimide (DABPA/BMI-3000 = 33.5:66.5) | | | 100 | | | | |
| | Terminal hydroxyl maleimide (aminophenol/BMI-3000 = 33.5:66.5) | | | | 100 | | | |
| | Terminal amino maleimide (ODA/BMI-3000 = 33.5:66.5) | | | | | 100 | | |
| | Maleimide | | | | | | 100 | |
| | Aliphatic long chain maleimide | | | | | | | 100 |
| | Aliphatic long chain maleimide | | | | | | | |
| Cross-linking agent | 3,3',4,4'-Biphenyltetracarboxylic dianhydride | | | | | | | |
| | Vinylbenzyl amine | | | | | | | |
| | 2,2'-diallyl bisphenol A | | | | | | | |
| | P-aminophenol | | | | | | | |
| | 4,4'-oxydianiline | | | | | | | |
| Peroxide | Peroxide | | 1 | 1 | 1 | 1 | 1 | 1 |
| Inorganic filler | Spherical silica | | 50 | 50 | 50 | 50 | 50 | 50 |
| Solvent | Toluene | | 100 | 100 | 100 | 100 | 100 | 100 |

TABLE 2

Constituent of resin compositions in Examples and Comparative Examples (Unit: parts by weight)

| Resin Constituent | Component | | C7 | C8 | C9 | C10 | C11 |
|---|---|---|---|---|---|---|---|
| Polyphenylene oxide | Vinylbenzyl polyphenylene oxide | OPE-2st | | | | | |
| Maleimide | Terminal vinyl maleimide (VBA:BMI-3000 = 33.5:66.5) | Product B | | | | | |
| | Terminal vinyl maleimide (VBA:BMI-3000 = 20:80) | Product C | | | | | |
| | Terminal vinyl maleimide (VBA:BMI-1700 = 33.5:66.5) | Product D | | | | | |
| | Terminal vinyl maleimide (VBA:BMI-70 = 33.5:66.5) | Product E | | | | | |
| | Terminal hydroxyl maleimide (DABPA/BMI-3000 = 33.5:66.5) | Product F | | | | | |
| | Terminal hydroxyl maleimide (aminophenol/BMI-3000 = 33.5:66.5) | Product G | | | | | |
| | Terminal amino maleimide (ODA/BMI-3000 = 33.5:66.5) | Product H | | | | | |
| | Maleimide | BMI-70 | | | | | |
| | Aliphatic long chain maleimide | BMI-3000 | | 66.5 | | | 80 |
| | Aliphatic long chain maleimide | BMI-1700 | 100 | | 66.5 | | |
| Cross-linking agent | 3,3',4,4'-Biphenyltetracarboxylic dianhydride | BPDA | | | | 66.5 | |
| | Vinylbenzyl amine | VBA | | 33.5 | 33.5 | 33.5 | 20 |
| | 2,2'-diallyl bisphenol A | DABPA | | | | | |
| | P-aminophenol | | | | | | |
| | 4,4'-oxydianiline | ODA | | | | | |
| Peroxide | Peroxide | 25B | 1 | 1 | .1 | 1 | 1 |
| Inorganic filler | Spherical silica | SC2500SMJ | 50 | 50 | 50 | 50 | 50 |
| Solvent | Toluene | Toluene | 100 | 100 | 100 | 100 | 100 |

TABLE 2-continued

Constituent of resin compositions in Examples and Comparative Examples (Unit: parts by weight)

| Resin Constituent | Component | C12 | C13 | C14 | C15 | C16 | C17 | C18 |
|---|---|---|---|---|---|---|---|---|
| Polyphenylene oxide | Vinylbenzyl polyphenylene oxide | | | | | 60 | 100 | 60 |
| Maleimide | Terminal vinyl maleimide (VBA:BMI-3000 = 33.5:66.5) | | | | | | | |
| | Terminal vinyl maleimide (VBA:BMI-3000 = 20:80) | | | | | | | |
| | Terminal vinyl maleimide (VBA:BMI-1700 = 33.5:66.5) | | | | | | | |
| | Terminal vinyl maleimide (VBA:BMI-70 = 33.5:66.5) | | | | | | | 40 |
| | Terminal hydroxyl maleimide (DABPA/BMI-3000 = 33.5:66.5) | | | | | | | |
| | Terminal hydroxyl maleimide (aminophenol/BMI-3000 = 33.5:66.5) | | | | | | | |
| | Terminal amino maleimide (ODA/BMI-3000 = 33.5:66.5) | | | | | | | |
| | Maleimide | | | | 66.5 | | | |
| | Aliphatic long chain maleimide | 66.5 | 66.5 | 66.5 | | | 26.7 | |
| | Aliphatic long chain maleimide | | | | | | | |
| Cross-linking agent | 3,3',4,4'-Biphenyltetracarboxylic dianhydride | | | | | | | |
| | Vinylbenzyl amine | | | | | 33.5 | 13.3 | |
| | 2,2'-diallyl bisphenol A | 33.5 | | | | | | |
| | P-aminophenol | | 33.5 | | | | | |
| | 4,4'-oxydianiline | | | 33.5 | | | | |
| Peroxide | Peroxide | 1 | 1 | 1 | 1. | 1 | 1 | 1 |
| Inorganic filler | Spherical silica | 50 | 50 | 50 | 50 | 50 | 50 | 50 |
| Solvent | Toluene | 100 | 100 | 100 | 100 | 100 | 100 | 100 |

TABLE 3

Test results for Examples and Comparative Examples

| Property | Test item (method) | Unit | E1 | E2 | E3 | E4 | E5 |
|---|---|---|---|---|---|---|---|
| Resin flow | Resin flow | % | 21 | 28 | 27 | 18 | 15 |
| Resin filling property | void exists observed by SEM | No unit | No | No | No | No | No |
| Compatibility | While precipitant occurs at the bottom of the varnish | No unit | No | No | No | No | No |
| PP formability | RC value (2116*4 sheets) | % | 52 | 52 | 52 | 52 | 52 |
| Dense hole test | Pass rate of dense hole thermal resistance test (a pitch of 1.0 mm between holes) | % | 100 | 100 | 100 | 100 | 100 |
| Dense hole test | Pass rate of dense hole thermal resistance test (a pitch of 0.7 mm between holes) | % | 100 | 100 | 100 | 100 | 100 |
| T288 thermal resistance | T288 (TMA) | Minute | >70 | >70 | >70 | >70 | >70 |
| Solder dipping | S/D | Times | >20 | >20 | >20 | >20 | >20 |
| Thermal resistance after moisture absorption | PCT (3 hr) | No unit | No delamination | No delamination | No delamination | No delamination | No delamination |
| Dielectric constant | Dk@10 GHz (1080*2 sheets) | No unit | 2.85 | 2.75 | 2.9 | 2.98 | 2.91 |
| Df after moisture absorption | Df@10 GHz (1080*2 sheets) | No unit | 0.0026 | 0.0025 | 0.0028 | 0.0029 | 0.0034 |
| Dissipation factor | Df@10 GHz (1080*2 sheets) | No unit | 0.0024 | 0.0023 | 0.0026 | 0.0026 | 0.0029 |
| Interlayer adhesion | Interlayer adhesion force (ply to ply) | lb/in | 4.05 | 4.15 | 3.95 | 3.55 | 3.75 |

| Property | C1 | C2 | C3 | C4 | C5 | C6 |
|---|---|---|---|---|---|---|
| Resin flow | 10 | 10 | 12 | 11 | >30 | 26 |
| Resin filling property | Yes | Yes | Yes | Yes | — | No |
| Compatibility | Yes | No | No | No | Yes | No |
| PP formability | 52 | 52 | 52 | 52 | <30 | 52 |

TABLE 3-continued

Test results for Examples and Comparative Examples

| | | | | | | |
|---|---|---|---|---|---|---|
| Dense hole test | 95 | 100 | 100 | 90 | — | 98 |
| Dense hole test | 90 | 95 | 97 | 85 | — | 89 |
| T288 thermal resistance | >70 | >70 | 30 | 24 | — | >70 |
| Solder dipping | >20 | >20 | 15 | 15 | — | >20 |
| Thermal resistance after moisture absorption | No delamination | No delamination | Delamination | Delamination | — | No delamination |
| Dielectric constant | 3.41 | 3.41 | 3.48 | 3.51 | — | 2.78 |
| Df after moisture absorption | 0.0055 | 0.0063 | 0.0075 | 0.0058 | — | 0.0023 |
| Dissipation factor | 0.0046 | 0.0046 | 0.0057 | 0.0068 | — | 0.0021 |
| Interlayer adhesion | 3.35 | 3.45 | 3.49 | 3.49 | — | 3.86 |

"—" means that such item is not tested

TABLE 4

Test results for Examples and Comparative Examples

| Property | Test item (method) | Unit | C7 | C8 | C9 | C10 | C11 |
|---|---|---|---|---|---|---|---|
| Resin flow | Resin flow | % | >30 | 21 | 19 | 12 | 16 |
| Resin filling property | void exists observed by SEM | No unit | No | Yes | Yes | Yes | Yes |
| Compatibility | White precipitant occurs at the bottom of the varnish | No unit | No | No | No | No | No |
| PP formability | RC value (2116*4 sheets) | % | 52 | 52 | 52 | 52 | 52 |
| Dense hole test | Pass rate of dense hole thermal resistance test (a pitch of 1.0 mm between holes) | % | 99 | 96 | 96 | 89 | 97 |
| Dense hole test | Pass rate of dense hole thermal resistance test (a pitch of 0.7 mm between holes) | % | 91 | 91 | 91 | 75 | 94 |
| T288 thermal resistance | T288 (TMA) | Minute | >70 | 31 | 33 | 30 | 32 |
| Solder dipping | S/D | Times | >20 | >20 | 18 | 16 | 17 |
| Thermal resistance after moisture absorption | PCT (3 hr) | No unit | No delamination | No delamination | No delamination | Delamination | No delamination |
| Dielectric constant | Dk@10 GHz (1080*2 sheets) | No unit | 2.68 | 2.88 | 2.83 | 3.56 | 2.87 |
| Df after moisture absorption | Df@10 GHz (1080*2 sheets) | No unit | 0.0029 | 0.0042 | 0.0045 | 0.0053 | 0.0031 |
| Dissipation factor | Df@10 GHz (1080*2 sheets) | No unit | 0.0023 | 0.0037 | 0.0038 | 0.0042 | 0.0024 |
| Interlayer adhesion | Interlayer adhesion force (ply to ply) | lb/in | 3.16 | 3.56 | 3.47 | 2.98 | 3.91 |

| Property | C12 | C13 | C14 | C15 | C16 | C17 | C18 |
|---|---|---|---|---|---|---|---|
| Resin flow | 21 | 19 | 20 | 23 | 23 | 5 | 19 |
| Resin filling property | Yes | Yes | Yes | Yes | Yes | Yes | Yes |
| Compatibility | No | No | No | Yes | No | No | No |
| PP formability | 52 | 52 | 52 | 52 | 52 | 52 | 52 |
| Dense hole test | 93 | 92 | 91 | 98 | 100 | 100 | 100 |
| Dense hole test | 91 | 89 | 84 | 94 | 96 | 98 | 97 |
| T288 thermal resistance | 33 | 31 | 32 | >70 | 24 | 60 | 15 |
| Solder dipping | 14 | 15 | 15 | >20 | 12 | >20 | 12 |
| Thermal resistance after moisture absorption | No delamination | No delamination | No delamination | No delamination | No delamination | No delamination | Delamination |

TABLE 4-continued

| Test results for Examples and Comparative Examples | | | | | | | |
|---|---|---|---|---|---|---|---|
| Dielectric constant | 3.13 | 3.41 | 3.49 | 3.55 | 3.35 | 3.05 | 3.56 |
| Df after moisture absorption | 0.0052 | 0.0053 | 0.0057 | — | — | — | — |
| Dissipation factor | 0.0034 | 0.0041 | 0.0042 | 0.0035 | 0.0038 | 0.0038 | 0.0067 |
| Interlayer adhesion | 3.88 | 3.86 | 3.89 | 3.12 | 3.06 | 2.65 | 3.18 |

"—" means that such item is not tested

What is claimed is:

1. A vinyl-modified maleimide made from the reaction of 4-vinylbenzyl amine with aliphatic long chain maleimide, wherein the aliphatic long chain maleimide comprises an aliphatic long chain maleimide having a structure unit represented by one of the following formula (6) and formula (7)

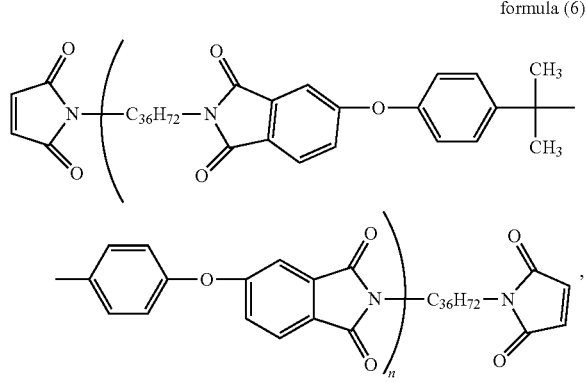

formula (6)

wherein n=1 to 10; or

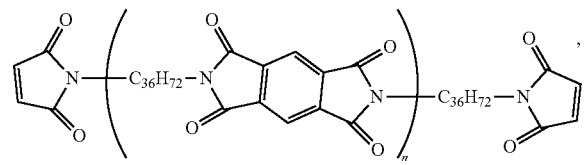

formula (7)

wherein n=1 to 10, and the reaction ratio (part by weight) of the 4-vinylbenzyl amine to the aliphatic long chain maleimide is 20:80 to 35:65.

2. A resin composition, comprising the vinyl-modified maleimide of claim 1 and at least one cross-linking agent.

3. The resin composition of claim 2, wherein the cross-linking agent comprises at least one of divinylbenzene, bis(vinylbenzyl) ether, 1,2-bis(vinylphenyl)ethane, triallyl isocyanurate, triallyl cyanurate, cyanate ester, isocyanate ester, 1,2,4-trivinylcyclohexane, styrene, acrylate, polyphenylene oxide resin, polyamide, polyimide, styrene maleic anhydride copolymer, polyester, an olefin polymer, an epoxy resin and an anhydride curing agent, a prepolymer or a combination thereof.

4. The resin composition of claim 2, further comprising a flame retardant, a curing accelerator, an inorganic filler, a surfactant, a toughener, a solvent or a combination thereof.

5. The resin composition of claim 2, wherein the resin composition comprises 100 parts by weight of the vinyl-modified maleimide and 1 to 500 parts by weight of the cross-linking agent.

6. An article made from the resin composition of claim 2, comprising a resin film, a prepreg, a resin coated copper, a laminate or a printed circuit board.

* * * * *